United States Patent
Kobayashi et al.

(10) Patent No.: US 10,763,353 B2
(45) Date of Patent: Sep. 1, 2020

(54) SEMICONDUCTOR DEVICE (71) Applicant: FUJI ELECTRIC CO., LTD., Kawasaki-shi (JP)

(72) Inventors: Yusuke Kobayashi, Tsukuba (JP); Naoyuki Ohse, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 23 days.

(21) Appl. No.: 16/284,658

(22) Filed: Feb. 25, 2019

(65) Prior Publication Data
US 2019/0280118 A1   Sep. 12, 2019

(30) Foreign Application Priority Data

Mar. 9, 2018   (JP) ................ 2018-042674

(51) Int. Cl.
| | |
|---|---|
| *H01L 29/78* | (2006.01) |
| *H01L 29/66* | (2006.01) |
| *H01L 29/47* | (2006.01) |
| *H01L 29/808* | (2006.01) |
| *H01L 29/16* | (2006.01) |

(52) U.S. Cl.
CPC ...... *H01L 29/7813* (2013.01); *H01L 29/1608* (2013.01); *H01L 29/47* (2013.01); *H01L 29/66666* (2013.01); *H01L 29/66734* (2013.01); *H01L 29/7806* (2013.01); *H01L 29/8083* (2013.01)

(58) Field of Classification Search
CPC ................................................ H01L 29/0623
See application file for complete search history.

(56) References Cited

U.S. PATENT DOCUMENTS

| | | | |
|---|---|---|---|
| 7,400,014 B2* | 7/2008 | Thapar ................ | H01L 29/407 257/330 |
| 2005/0045960 A1* | 3/2005 | Takahashi .......... | H01L 29/0696 257/368 |
| 2006/0065923 A1* | 3/2006 | Pfirsch .............. | H01L 29/41 257/328 |
| 2008/0012050 A1 | 1/2008 | Aoki et al. | |
| 2017/0077299 A1 | 3/2017 | Shimizu et al. | |
| 2018/0301549 A1* | 10/2018 | Takeuchi ............ | H02M 1/08 |
| 2018/0358449 A1* | 12/2018 | Zeng ................. | H01L 29/4236 |
| 2019/0288104 A1* | 9/2019 | Kinoshita ......... | H01L 29/7397 |

FOREIGN PATENT DOCUMENTS

| | | |
|---|---|---|
| JP | 2008-21930 A | 1/2008 |
| JP | 2015-162579 A | 9/2015 |
| JP | 2017-55005 A | 3/2017 |

* cited by examiner

*Primary Examiner* — Thao P Le (57) ABSTRACT

A first $p^+$-type region in contact with a bottom of a gate trench is disposed in a striped shape extending along a first direction that is orthogonal to a second direction along which the gate trench extends in a striped shape, as viewed from a front surface of a silicon carbide substrate. As a result, trench gate MOSFETs are disposed in parallel at a predetermined cell pitch along the first direction. A flat SBD is disposed at a predetermined cell pitch along the second direction. The cell pitch of the trench gate MOSFET and the cell pitch of the flat SBD may be set independently of each other.

5 Claims, 8 Drawing Sheets

FIG.9
RELATED ART

SEMICONDUCTOR DEVICE

CROSS REFERENCE TO RELATED APPLICATIONS

This application is based upon and claims the benefit of priority of the prior Japanese Patent Application No. 2018-042674, filed on Mar. 9, 2018, the entire contents of which are incorporated herein by reference.

BACKGROUND

1. Field

Embodiments discussed herein relate to a semiconductor device.

2. Description of the Related Art

Conventionally, to realize low ON resistance in a vertical metal oxide semiconductor field effect transistor (MOSFET) that uses silicon carbide (SiC), a trench gate structure is employed that structurally facilitates low ON resistance characteristics as compared to a planar gate structure in which a MOS gate is provided in a flat plate shape on a front surface of a semiconductor substrate (hereinafter, silicon carbide substrate (semiconductor chip)) containing silicon carbide. The trench gate structure is a MOS gate structure in which a MOS gate is embedded in a trench formed at the front surface of the silicon carbide substrate, enabling reduction of the ON resistance by shortening cell pitch (repetition interval of a unit cell (constituent unit of an element)).

Further, a Schottky barrier diode (SBD) is disposed in a flat plate shape on the front surface of the silicon carbide substrate disposed with the trench gate MOSFET, whereby degradation of a parasitic pn junction diode (body diode) formed by a pn junction of a base region and a drift region of the trench gate MOSFET may be suppressed (for example, refer to Japanese Laid-Open Patent Publication No. 2008-021930). A structure of a conventional trench gate MOSFET will be described in which, on the front surface of the silicon carbide substrate in which a trench gate MOSFET is disposed in this manner, a SBD (hereinafter, flat SBD) is disposed in a flat plate shape, whereby the flat SBD is built into the same silicon carbide substrate.

Figure 7:
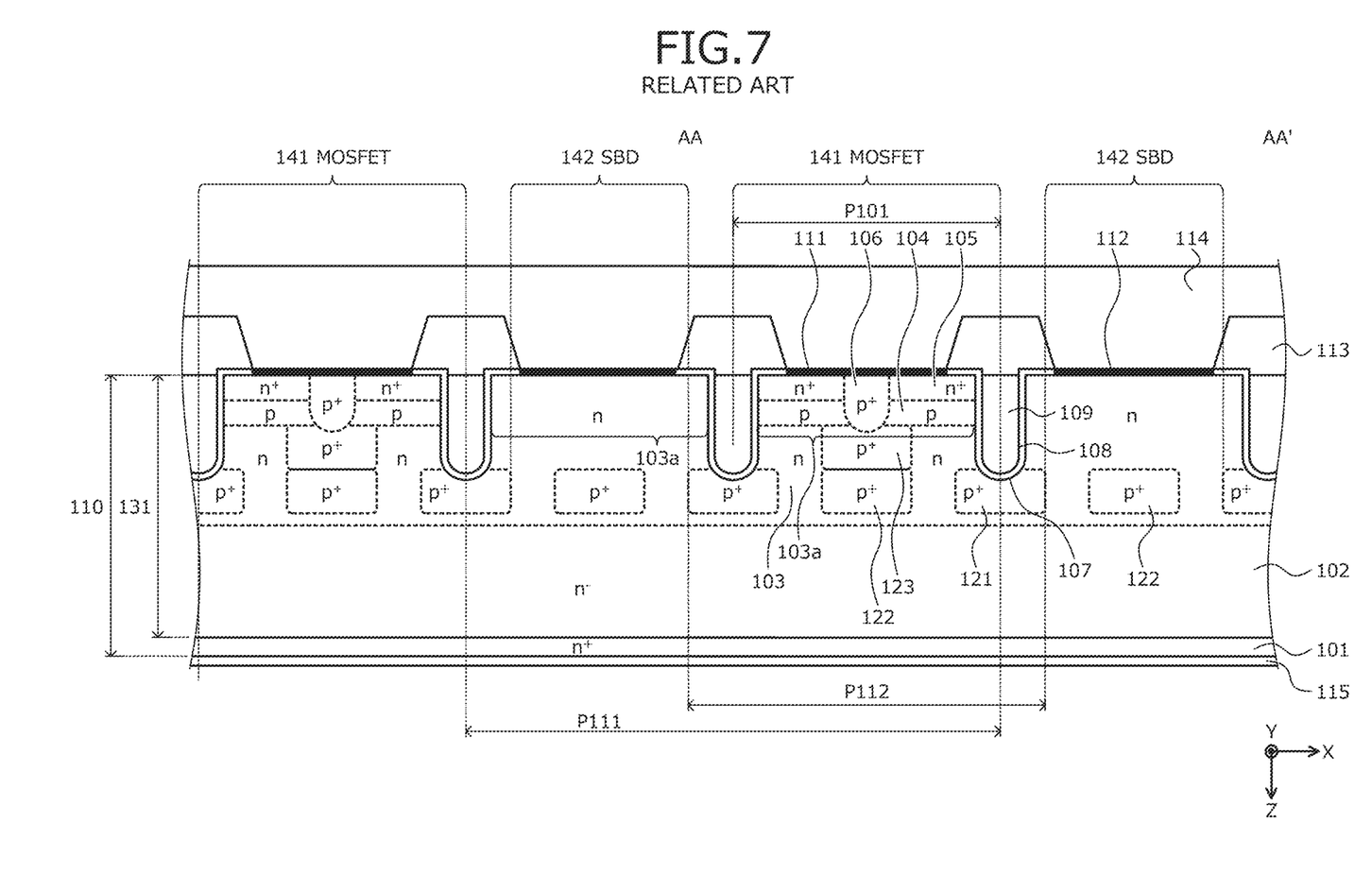
FIG. 7 is a cross-sectional view of an example of a structure of a conventional silicon carbide semiconductor device.
Figure 8:
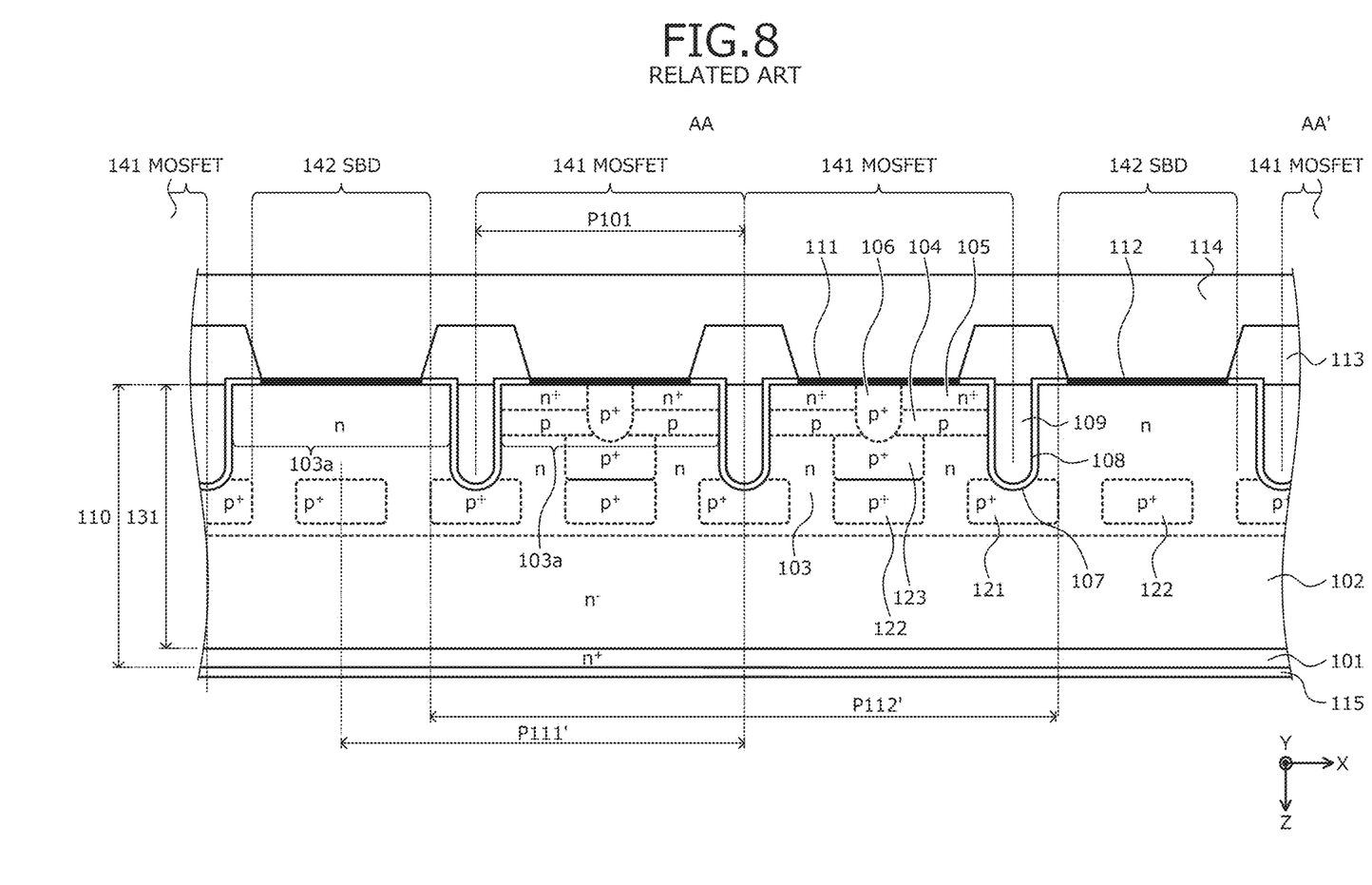
FIG. 8 is a cross-sectional view of an example of a structure of a conventional silicon carbide semiconductor device.
Figure 9:
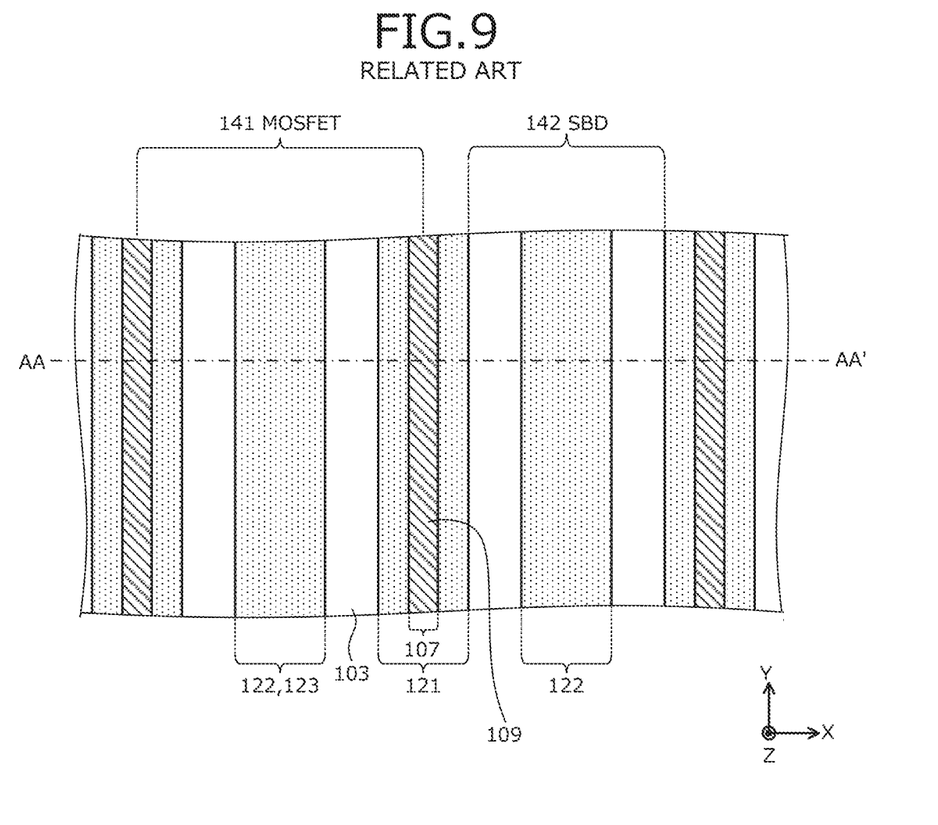
FIG. 9 is a plan view of a layout when main parts in FIGS. 7 and 8 are viewed from a front surface of a semiconductor substrate.

FIGS. 7 and 8 are cross-sectional views of an example of a structure of a conventional silicon carbide semiconductor device. FIGS. 7 and 8 depict cross-sectional views of the structure at cutting line AA-AA' in FIG. 9. In FIGS. 7 and 8, examples are depicted in which in the conventional silicon carbide semiconductor device depicted, the flat SBD 142 is disposed at mutually differing cell pitches P112, P112'. Configuration (structure of the unit cell of a trench gate MOSFET 141, structure of the unit cell of the flat SBD 142) excluding the cell pitch P112 of the flat SBD 142 is similar in FIGS. 7 and 8. FIG. 9 is a plan view of a layout when main parts in FIGS. 7 and 8 are viewed from a front surface of the semiconductor substrate. FIG. 9 depicts a layout of a gate trench 107 and first to third $p^+$-type regions 121 to 123 in FIGS. 7 and 8.

The conventional silicon carbide semiconductor device depicted in FIGS. 7 and 8 has a configuration in which at a front surface of a silicon carbide substrate 110 that contains silicon carbide, a trench (hereinafter, gate trench) 107 in which a MOS gate of the trench gate MOSFET 141 is embedded is disposed at a predetermined pitch P101, and between adjacent gate trenches 107, a unit cell of the trench gate MOSFET 141 or a unit cell of the flat SBD 142 is disposed. The unit cell of the trench gate MOSFET 141 and the unit cell of the flat SBD 142 are disposed at predetermined cell pitches (indicated by reference characters P111 and P112 in FIG. 7, and reference characters P111' and P112' in FIG. 8), respectively. The silicon carbide substrate 110 is an epitaxial substrate in which an $n^-$-type silicon carbide layer 131 constituting an $n^-$-type drift region 102 is formed by epitaxial growth on an $n^+$-type starting substrate 101 containing silicon carbide.

The trench gate MOSFET 141 has a p-type base region 104, an $n^+$-type source region 105, and a $p^+$-type contact region 106 between adjacent gate trenches 107 (in a mesa region 103a). A single unit cell of the trench gate MOSFET 141 is configured by a region between centers of the adjacent gate trenches 107; the p-type base region 104, the $n^+$-type source region 105, and the $p^+$-type contact region 106 being between the centers of the adjacent gate trenches 107. The $p^+$-type region 121 is in contact with a bottom of the gate trench 107. In the mesa region 103a, the second and the third $p^+$-type regions 122, 123 are each selectively disposed separated from the $p^+$-type region 121.

The second and the third $p^+$-type regions 122, 123 are disposed separated from the gate trench 107. Further, the second $p^+$-type region 122 is disposed separated from the p-type base region 104 and opposes the $p^+$-type contact region 106 along a depth direction Z. The third $p^+$-type region 123 is disposed between the p-type base region 104 and the second $p^+$-type region 122, and is in contact with the p-type base region 104, the $p^+$-type contact region 106, and the second $p^+$-type region 122. In the mesa region 103a in which the flat SBD 142 is disposed, the p-type base region 104, the $n^+$-type source region 105, the $p^+$-type contact region 106, and the third $p^+$-type region 123 are not provided, and an n-type current diffusion region 103 is exposed at the front surface (surface on a side of the silicon carbide substrate 110 having the $n^-$-type silicon carbide layer 131) of the silicon carbide substrate 110.

A single unit cell of the flat SBD 142 is configured by a Schottky junction of the n-type current diffusion region 103 and a conductive layer 112 disposed on the front surface of the silicon carbide substrate 110, in a region between the first $p^+$-type regions 121. The gate trench 107 is disposed in parallel at the predetermined pitch P101 along a direction (hereinafter, first direction) X parallel to the front surface of the silicon carbide substrate 110. Further, the gate trench 107 (darkly hatched part), as viewed from the front surface of the silicon carbide substrate 110, is disposed in a striped layout extending along a direction (hereinafter, second direction) Y parallel to the front surface of the silicon carbide substrate 110 and orthogonal to the first direction X (refer to FIG. 9).

The first to the third $p^+$-type regions 121 to 123 (lightly hatched parts), similarly to the gate trench 107, are disposed along the first direction X, in a striped layout extending along the second direction Y, as viewed from the front surface of the silicon carbide substrate 110. In this manner, the trench gate MOSFET 141 and the flat SBD 142 are disposed at predetermined cell pitches (reference characters P111, P112 in FIG. 7, and reference characters P111', P112' in FIG. 8) along the first direction X. Reference numeral 111 is a conductive layer forming an ohmic contact with the $n^+$-type source region 105 and with the $p^+$-type contact region 106. Reference numerals 113, 114, and 115 are an interlayer insulating film, a front electrode, and a rear electrode, respectively.

Further, as depicted in FIG. 7, a unit cell of the trench gate MOSFET 141 and a unit cell of the flat SBD 142 are disposed repeatedly alternating along the first direction X. In this case, the cell pitch P111 of the trench gate MOSFET 141 is 2 times the pitch P101 of the gate trench 107 (P111=2×P101). The cell pitch P112 of the flat SBD 142 is substantially equal to the pitch P101 of the gate trench 107 (P112≈P101).

As depicted in FIG. 8, for every 2 unit cells of the trench gate MOSFET 141 disposed adjacently along the first direction X, 1 unit cell of the flat SBD 142 is disposed adjacently along the first direction X. In this case, the cell pitch P111 of the trench gate MOSFET 141' is 3/2 times the pitch P101 of the gate trench 107 (P111'=(3/2)×P101). The cell pitch P112' of the flat SBD 142 is substantially 2 times the pitch P101 of the gate trench 107 (P112'≈2×P101).

When the cell pitch P111 of the trench gate MOSFET 141' is smaller (refer to FIG. 8), ON resistance of the trench gate MOSFET 141 decreases. When the cell pitch P112 of the flat SBD 142 is smaller (refer to FIG. 7), operation starting current of a p-intrinsic-n (pin) diode of the trench gate MOSFET 141 increases, the pin diode being formed by pn junctions between the p-type base region 104 and the $n^-$-type drift region 102 and the $n^+$-type starting substrate 101. As a result, a degradation suppression effect of a body diode (parasitic pn junction diode formed by a pn junction between the p-type base region 104 and the $n^-$-type drift region 102) of the trench gate MOSFET 141 improves.

As a conventional trench gate MOSFET, a device has been proposed that realizes reduced loss and suppression of degradation of a body diode by a normally-off junction FET (JFET) disposed on a same semiconductor substrate as a trench gate MOSFET being operated so that only reflux current flows in the JFET (for example, refer to Japanese Laid-Open Patent Publication No. 2015-162579 (paragraphs 0022, 0050, and 0109; FIG. 5)).

As a conventional trench gate MOSFET having a SBD built into the same silicon carbide substrate, a device has been proposed that reduces the cell pitch of a trench gate MOSFET and realizes reduced ON resistance by embedding only a metal layer in a trench provided separated from a gate trench and by forming at the bottom of the trench, a Schottky junction between an n-type drift region and the metal layer (for example, refer to Japanese Laid-Open Patent Publication No. 2017-055005 (paragraphs 0037 and 0126; FIG. 5)).

SUMMARY

According to an embodiment of the present invention, a semiconductor device includes a semiconductor substrate of a first conductivity type and containing a semiconductor material having a bandgap wider than that of silicon; a plurality of trenches provided a predetermined depth from a front surface of the semiconductor substrate, the plurality of trenches being provided at a predetermined pitch along a first direction parallel to the front surface of the semiconductor substrate; a gate electrode provided in the trench, via a gate insulating film; a first semiconductor region of a second conductivity type provided spanning between adjacent trenches of the plurality of trenches, in a first mesa region between the adjacent trenches; a second semiconductor region of the first conductivity type selectively provided in the first semiconductor region; a MOS gate structure constituted by the gate insulating film, the gate electrode, the first semiconductor region and the second semiconductor region; a conductive layer sandwiched between adjacent trenches of the plurality of trenches and provided on a surface of a second mesa region excluding the first mesa region; a Schottky barrier diode configured by a Schottky junction of the conductive layer and the semiconductor substrate; a third semiconductor region of the second conductivity type selectively provided in the semiconductor substrate, the third semiconductor region in contact with bottoms of the plurality of trenches; a fourth semiconductor region of the second conductivity type selectively provided between the first semiconductor region and the third semiconductor region, the fourth semiconductor region being provided in contact with the first semiconductor region and the third semiconductor region, and separated from the plurality of trenches; a first electrode electrically connected to the first semiconductor region, the second semiconductor region, and the conductive layer; and a second electrode provided at a rear surface of the semiconductor substrate. The plurality of trenches are disposed in a striped shape extending along a second direction orthogonal to the first direction and parallel to the front surface of the semiconductor substrate. The third semiconductor region is disposed in a striped shape extending along the first direction.

In the embodiment, one unit cell of the MOS gate structure is provided in one first mesa region. The unit cell of the MOS gate structure is disposed at a predetermined pitch along the first direction.

In the embodiment, a unit cell of the Schottky barrier diode is disposed at a predetermined pitch along the second direction.

In the embodiment, for every two of the first mesa regions disposed adjacently to each other along the first direction, one of the second mesa regions is disposed.

In the embodiment, the semiconductor device further includes a fifth semiconductor region of the first conductivity type provided in a surface layer of the front surface of the semiconductor substrate, the fifth semiconductor region reaching a position deeper from the front surface of the semiconductor substrate than are the bottoms of the plurality of trenches, the fifth semiconductor region having an impurity concentration higher than an impurity concentration of the semiconductor substrate. The first semiconductor region, the third semiconductor region, and the fourth semiconductor region are disposed in the fifth semiconductor region.

Objects, features, and advantages of the present invention are specifically set forth in or will become apparent from the following detailed description of the invention when read in conjunction with the accompanying drawings.

DESCRIPTION OF EMBODIMENTS

First, problems associated with the related arts will be described. In the described conventional silicon carbide semiconductor device, when the cell pitch P111' of the trench gate MOSFET 141' is reduced (refer to FIG. 8), the cell pitch P112' of the flat SBD 142 increases. On the other hand, when the cell pitch P112 of the flat SBD 142 is reduced (refer to FIG. 7), the cell pitch P111 of the trench gate MOSFET 141 increases. Therefore, reduction of the ON resistance of the trench gate MOSFET 141 and improvement of the degradation suppression effect of the body diode have a tradeoff relationship.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
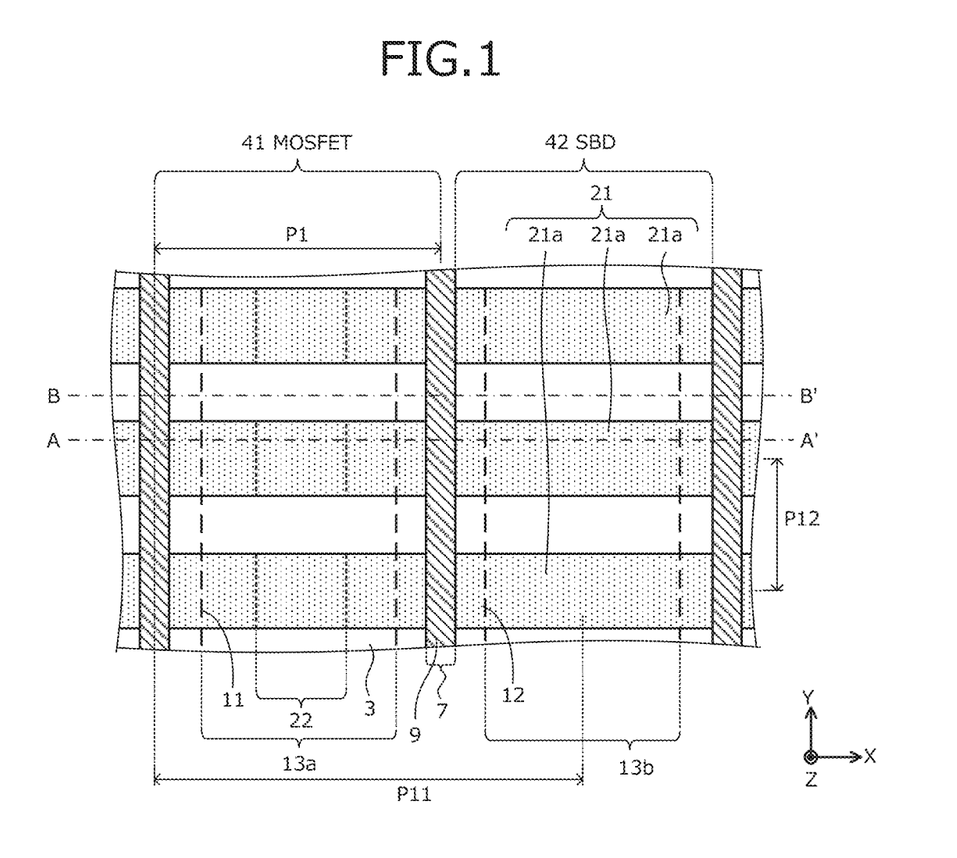
FIG. 1 is a plan view of a layout when main parts of a silicon carbide semiconductor device according to an embodiment are viewed from a front surface of a semiconductor substrate.
Figure 2:
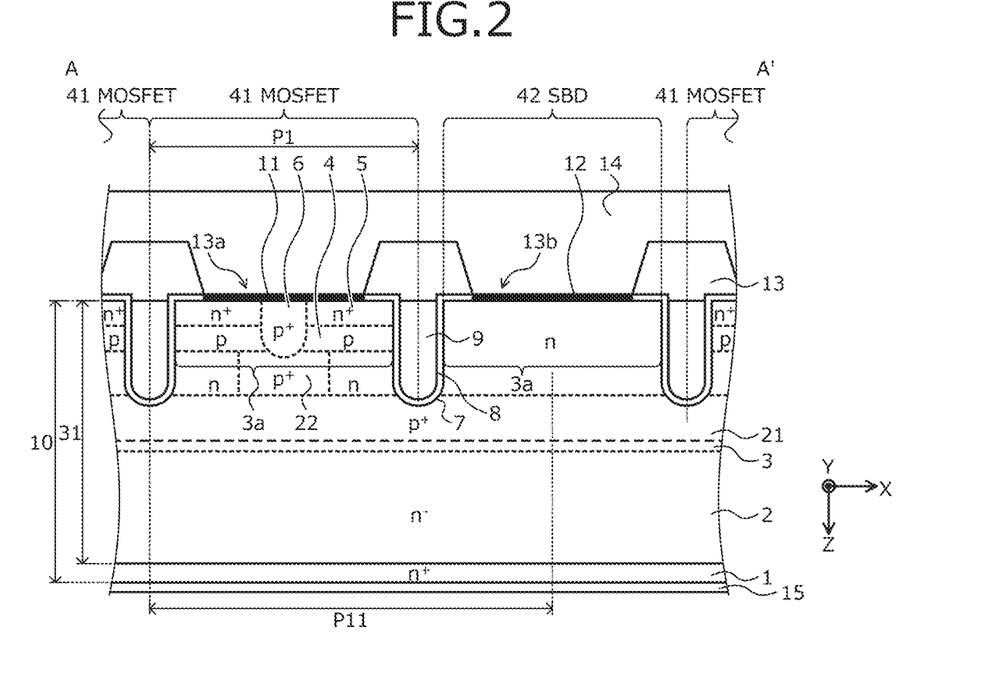
FIG. 2 is a cross-sectional view of a structure at cutting line A-A' in FIG. 1.
Figure 3:
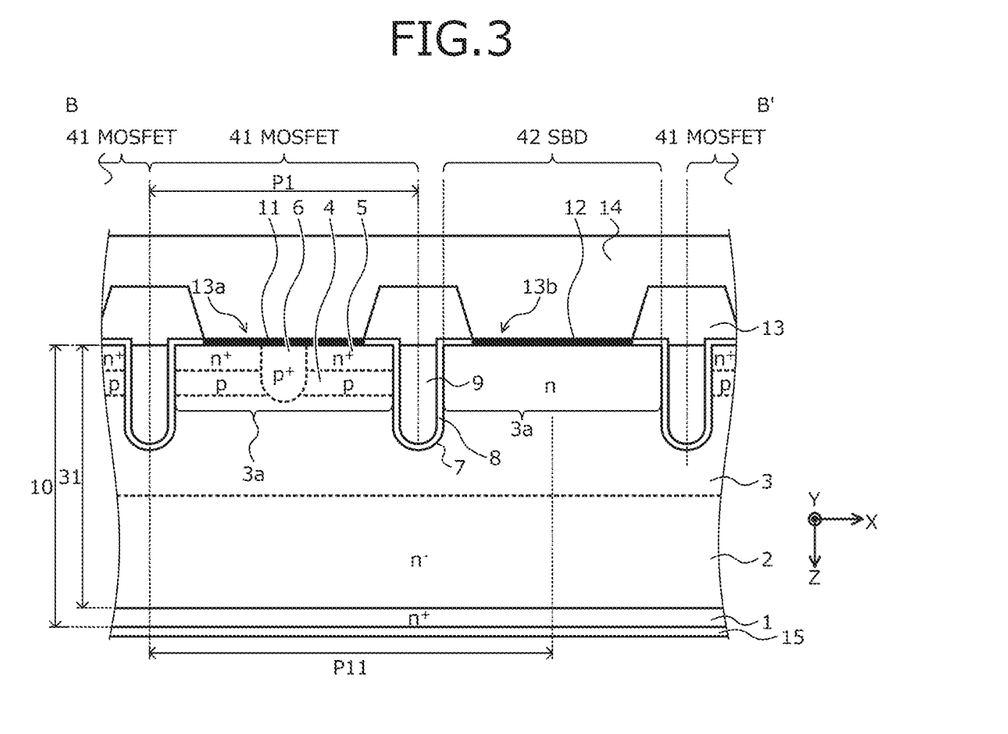
FIG. 3 is a cross-sectional view of the structure at cutting line B-B' in FIG. 1.

A semiconductor device according to an embodiment is configured using as a semiconductor material, a semiconductor material (wide bandgap semiconductor material) that has a bandgap wider than that of silicon (Si). Hereinafter, a structure of the semiconductor device according to the embodiment will be described taking, as an example, a case in which silicon carbide (SiC) is used as a semiconductor material. FIG. 1 is a plan view of a layout when main parts of a silicon carbide semiconductor device according to the embodiment are viewed from a front surface of a semiconductor substrate. FIG. 1 depicts a layout of a gate trench 7 and first and second p$^+$-type regions (third and fourth semiconductor regions) 21, 22 in FIGS. 2 and 3. FIG. 2 is a cross-sectional view of the structure at cutting line A-A' in FIG. 1. FIG. 3 is a cross-sectional view of the structure at cutting line B-B' in FIG. 1.

The silicon carbide semiconductor device according to the embodiment depicted in FIGS. 1 to 3 has a structure in which on a front surface of a semiconductor substrate (silicon carbide substrate (semiconductor chip)) 10 containing silicon carbide and in which a trench gate MOSFET 41 is disposed, a SBD (flat SBD) 42 is disposed in a flat plate shape. The silicon carbide substrate 10 is an epitaxial substrate in which an n$^-$-type silicon carbide layer 31 constituting an n$^-$-type drift region 2 is formed by epitaxial growth on a front surface of an n$^+$-type starting substrate 1 containing silicon carbide.

The n$^-$-type silicon carbide layer 31 has a surface layer (surface layer of the front surface of the silicon carbide substrate 10) on a first side that is opposite a second side facing toward the n$^+$-type starting substrate 1. An n-type region (hereinafter, n-type current diffusion region (fifth semiconductor region)) 3 is provided to a depth shallower from the front surface of the silicon carbide substrate 10 than is a depth to which the n$^-$-type silicon carbide layer 31 is provided. The n-type current diffusion region 3 is a so-called current spreading layer (CSL) that reduces carrier spreading current. The n-type current diffusion region 3 is provided uniformly parallel to the front surface of the silicon carbide substrate 10.

A part (i.e., a part between the n-type current diffusion region 3 and the n$^+$-type starting substrate 1) of the n$^-$-type silicon carbide layer 31 excluding the n-type current diffusion region 3 is the n$^-$-type drift region 2. A p-type base region (first semiconductor region) 4, an n$^+$-type source region (second semiconductor region) 5, a p$^+$-type contact region 6, and a trench (gate trench) 7 of the trench gate MOSFET 41, and the first and the second p$^+$-type regions 21, 22 are each selectively provided in the n-type current diffusion region 3. Without providing the n-type current diffusion region 3, the n$^-$-type silicon carbide layer 31 entirely may be set as the n$^-$-type drift region 2, and the p-type base region 4, the n$^+$-type source region 5, the p$^+$-type contact region 6, the gate trench 7, and the first and the second p$^+$-type regions 21, 22 may be provided in the n$^-$-type drift region 2.

The gate trench 7 is provided from the front surface of the silicon carbide substrate 10, to a depth shallower than a depth to which the n-type current diffusion region 3 is provided. The gate trench 7 is disposed at a predetermined pitch P1 along a direction (first direction) X parallel to the front surface of the silicon carbide substrate 10. Further, as viewed from the front surface of the silicon carbide substrate 10, the gate trench 7 (darkly hatched part) is disposed in a striped layout parallel to the front surface of the silicon carbide substrate 10 and extending along a direction (hereinafter, second direction) Y orthogonal to the first direction X (refer to FIG. 1).

In the gate trench 7, a gate electrode 9 is provided via a gate insulating film 8. A MOS gate of the trench gate MOSFET 41 is constituted by the gate trench 7, the gate insulating film 8, and the gate electrode 9. Between adjacent gate trenches 7 is a mesa region 3a and in each mesa region 3a, a unit cell of the trench gate MOSFET 41 or a unit cell of the flat SBD 42 is disposed.

In the mesa region (first mesa region) 3a in which the trench gate MOSFET 41 is disposed, the p-type base region 4, the n$^+$-type source region 5, and the p$^+$-type contact region 6 are disposed. A MOS gate structure is constituted by the p-type base region 4, the n$^+$-type source region 5, the p$^+$-type contact region 6, and the MOS gate (the gate trench 7, the gate insulating film 8, and the gate electrode 9). The p-type base region 4 is provided spanning between the adjacent gate trenches 7 and opposes the gate electrodes 9, across the gate insulating films 8 at side walls of the gate trenches 7.

The n$^+$-type source region 5 and the p$^+$-type contact region 6 are each selectively provided in the p-type base region 4 and are exposed at the front surface of the silicon carbide substrate 10. The n$^+$-type source region 5 opposes the gate electrodes 9, across the gate insulating films 8 at the side walls of the gate trenches 7. The p$^+$-type contact region 6 may penetrate the p-type base region 4 in the depth direction Z. The depth direction Z is a direction from the front surface of the silicon carbide substrate 10, toward a rear surface.

One unit cell of the trench gate MOSFET 41 is configured by a region between the gate trenches 7 that are adjacent to each other across the p-type base region 4, the n$^+$-type source region 5, and the p$^+$-type contact region 6. The unit cell of the trench gate MOSFET 41 is disposed in parallel at a predetermined cell pitch P11 along the first direction X. In other words, in each of the mesa regions 3a in which the trench gate MOSFET 41 is disposed, 1 unit cell of the trench gate MOSFET 41 is disposed.

The cell pitch P11 of the trench gate MOSFET 41 is set to be as small as possible. For example, along the first direction X, for every two of the mesa regions 3a disposed adjacently to each other and in each of which a unit cell of the trench gate MOSFET 41 is disposed, one of the mesa regions 3a in which a unit cell of the flat SBD 42 is disposed may be disposed. In this case, the cell pitch P11 of the trench gate MOSFET 41 is 3/2 times the pitch P1 of the gate trench 7 (P11=(3/2)×P1).

The p$^+$-type region 21 (light hatching), as viewed from the front surface of the silicon carbide substrate 10, is disposed in a striped layout extending along the first direction X (refer to FIG. 1). In other words, each linear part 21a formed by the striped layout of the first p$^+$-type region 21 is disposed so as to be substantially orthogonal to the striped layout of the gate trenches 7 and oppose all of the gate trenches 7 in the depth direction Z, selectively contacting bottoms of the gate trenches 7.

The linear parts 21a of the first p$^+$-type region 21 are disposed separated from the p-type base region 4. The second p$^+$-type region 22 is selectively provided between the linear parts 21a of the first p$^+$-type region 21 and the p-type base region 4. The second p$^+$-type region 22 is in contact with the p-type base region 4 (when the p$^+$-type contact region 6 penetrates the p-type base region 4 in the depth direction Z, the p-type base region 4 and the p$^+$-type contact region 6) and the first p$^+$-type region 21.

The second p$^+$-type region 22, for example, opposes the p$^+$-type contact region 6 in the depth direction Z. The second p$^+$-type region 22 is disposed separated from the gate trench 7 and is disposed only in the mesa regions 3a in which the trench gate MOSFET 41 is disposed. The second p$^+$-type region 22, for example, is disposed only between the linear parts 21a of the first p$^+$-type region 21 and the p-type base region 4 and is disposed at a predetermined interval along the second direction Y. In FIG. 1, the second p$^+$-type region 22 is indicated by a dotted line.

The flat SBD 42 is configured by a Schottky junction of the n-type current diffusion region 3 and a conductive layer 12 disposed on the front surface of the silicon carbide substrate 10. The p-type base region 4, the n$^+$-type source region 5, the p$^+$-type contact region 6, and the second p$^+$-type region 22 are not provided in the mesa region (second mesa region) 3a in which the flat SBD 42 is disposed. Further, in the mesa region 3a in which the flat SBD 42 is disposed, the n-type current diffusion region 3 is exposed at the front surface of the silicon carbide substrate 10 (surface on a side of the silicon carbide substrate 10 having the n$^-$-type silicon carbide layer 31).

A cell pitch P12 of the flat SBD 42 is determined by a width of the linear parts 21a of the first p$^+$-type region 21 and an arrangement interval (pitch) along the second direction Y. A reason for this is that spreading resistance of the first p$^+$-type region 21 greatly affects electrical characteristics of the flat SBD 42. Therefore, a direction along which the unit cells of the flat SBD 42 are disposed in parallel (the second direction Y) is orthogonal to a direction (the first direction X) along which the unit cells of the trench gate MOSFET 41 are disposed in parallel.

In the mesa regions 3a in which the trench gate MOSFET 41 is disposed, on the front surface of the silicon carbide substrate 10, a conductive layer 11 is provided forming an ohmic contact with the p$^+$-type contact region 6 and the n$^+$-type source region 5 exposed at a contact hole 13a. The conductive layer 11 functions as a source electrode of the trench gate MOSFET 41. The conductive layer 11, for example, as viewed from the front surface of the silicon carbide substrate 10, is disposed in a linear shape extending along the second direction Y (refer to FIG. 1). In FIG. 1, in the mesa regions in which the trench gate MOSFET 41 and the flat SBD 42 are disposed, respectively, a region between two dotted lines coarser than those of the second p$^+$-type region 22 depicted between the gate trenches 7 are the conductive layers 11, 12.

In the mesa region 3a in which the flat SBD 42 is disposed, on the front surface of the silicon carbide substrate 10, the conductive layer 12 is provided, forming a Schottky contact with the n-type current diffusion region 3 exposed at a contact hole 13b. The conductive layer 12 functions as the source electrode of the trench gate MOSFET 41. The conductive layer 11, for example, as viewed from the front surface of the silicon carbide substrate 10, is disposed in a linear shape extending along the second direction Y. The conductive layer 12, for example, as viewed from the front surface of the silicon carbide substrate 10, is disposed in a linear shape extending along the second direction Y (refer to FIG. 1).

The contact holes 13a, 13b, for example, as viewed from the front surface of the silicon carbide substrate 10, are each disposed in a linear shape extending along the second direction Y. On the front surface of the silicon carbide substrate 10, a front electrode (first electrode) 14 is provided so as to be embedded in the contact holes 13a, 13b. The front electrode 14 is in contact with the conductive layers 11, 12, is electrically connected to the conductive layers 11, 12, and is electrically insulated from the gate electrode 9 by an interlayer insulating film 13. A rear electrode (second electrode) 15 is provided at the rear surface (rear surface of the n$^+$-type starting substrate 1) of the silicon carbide substrate 10 overall. The rear electrode 15 is electrically connected to the n$^+$-type starting substrate 1 constituting an n$^+$-type drain region.

As described, according to a first embodiment, the first p$^+$-type region in contact with the bottoms of the gate trenches is disposed in a striped shape extending along a direction (first direction) orthogonal to a direction (second direction) along which the gate trenches provided in a striped shape extend, as viewed from the front surface of the silicon carbide substrate. As a result, the trench gate MOSFET may be disposed in parallel at a predetermined cell pitch along the first direction and the flat SBD may be disposed in parallel at a predetermined cell pitch along the second direction. Therefore, the cell pitch of the trench gate MOSFET and the cell pitch of the flat SBD may be set independently of each other. As a result, the cell pitch of the trench gate MOSFET may be reduced, reducing the ON resistance of the trench gate MOSFET and enabling the cell pitch of the flat SBD to be reduced and the degradation suppression effect of the body diode of the trench gate MOSFET to be improved. Therefore, the tradeoff relationship of reduction of the ON resistance of the trench gate MOSFET and improvement of the degradation suppression effect of the body diode may be improved.

Figure 4:
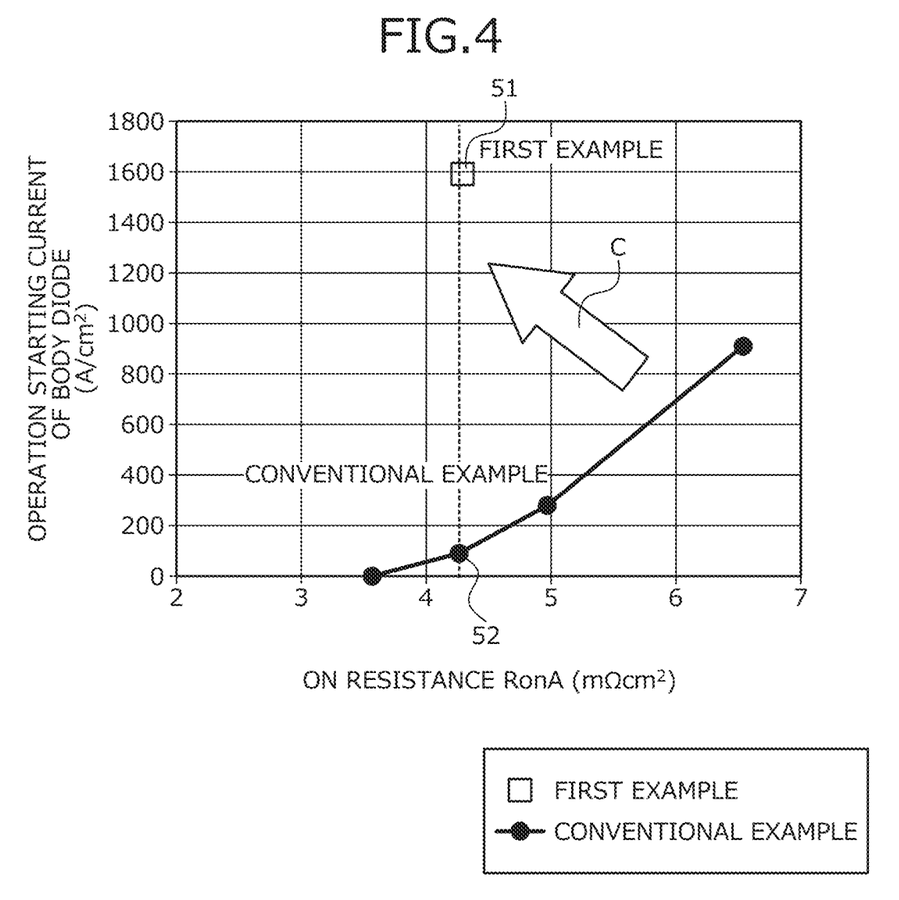
FIG. 4 is a characteristics diagram depicting a relationship of ON resistance of a trench gate MOSFET and operation starting current of a body diode, in the silicon carbide semiconductor device according to the embodiment.

A relationship of the ON resistance of the trench gate MOSFET 41 and the operation starting current of the body diode was verified. The body diode of the trench gate MOSFET 41 is a parasitic pin diode formed by pn junctions between the p-type base region 4 of the trench gate MOSFET 41 and the n$^-$-type drift region 2 and the n$^+$-type starting substrate 1. FIG. 4 is a characteristics diagram depicting the relationship of the ON resistance of the trench gate MOSFET and the operation starting current of the body diode, in the silicon carbide semiconductor device according to the embodiment.

The relationship of the ON resistance of the trench gate MOSFET 41 and the operation starting current of the body diode in the above silicon carbide semiconductor device according to the embodiment (hereinafter, first example) is depicted in FIG. 4. Further, in FIG. 4, a relationship of the ON resistance of the trench gate MOSFET 141 and operation starting current of the body diode in the conventional silicon carbide semiconductor device (hereinafter, conventional example, refer to FIGS. 7 to 9) is depicted. The conventional example is similar to the first example, excluding arrangement of the unit cell of the flat SBD 142, which differs from the arrangement in the first example.

From the results depicted in FIG. 4, in the first example, it was confirmed that when the ON resistance of the trench gate MOSFET 41 is equal to the ON resistance of the trench gate MOSFET 141 in the conventional example (for example, sample 51 of the first example and sample 52 of the conventional example), the operation starting current of the body diode of the trench gate MOSFET 41 may be higher than the operation starting current of the body diode of the trench gate MOSFET 141 of the conventional example. In other words, it was confirmed that as compared to the conventional example, in the first example, a direction (direction indicated by arrow C in FIG. 4 (direction upward toward left)) of improvement of the tradeoff relationship between reducing the ON resistance of the trench gate MOSFET 41 and improving the degradation suppression effect of the body diode, was changeable.

In FIG. 4, while only one sample (sample 51) of the first example is depicted, it was confirmed that in the first example, the ON resistance of the trench gate MOSFET 41 decreases as the cell pitch P11 of the trench gate MOSFET 41 is reduced (refer to FIG. 5 described hereinafter), and suppression of the degradation of the body diode of the trench gate MOSFET 41 increases as the cell pitch P12 of the flat SBD 42 is reduced (refer to FIG. 6 described hereinafter). In addition, for samples of the first example other than the sample 51, it was confirmed that effects similar to those of the sample 51 of the first example are obtained.

Figure 5:
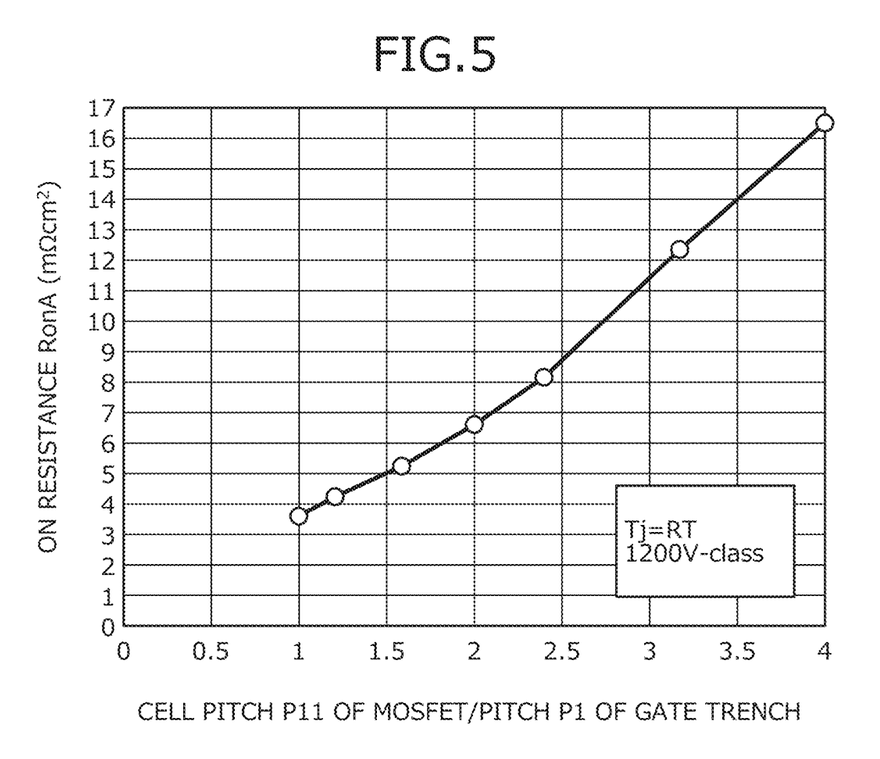
FIG. 5 is a characteristics diagram depicting a relationship of cell pitch of trench gate MOSFET and ON resistance in the silicon carbide semiconductor device according to the embodiment.

A relationship of the cell pitch P11 of the trench gate MOSFET 41 and ON resistance was verified. FIG. 5 is a characteristics diagram depicting a relationship of the cell pitch of trench gate MOSFET and ON resistance in the silicon carbide semiconductor device according to the embodiment. In FIG. 5, the cell pitch P11 (=the cell pitch P11 of the trench gate MOSFET 41/the pitch P1 of the gate trench 7) of the trench gate MOSFET 41 with respect to the pitch P1 of the gate trench 7 is indicated along a horizontal axis while the ON resistance of the trench gate MOSFET 41 is indicated along a vertical axis.

The relationship of the cell pitch P11 of the trench gate MOSFET 41 and ON resistance in the above silicon carbide semiconductor device according to the embodiment (hereinafter, second example) is depicted in FIG. 5. The trench gate MOSFET 41 has a breakdown voltage of 1200V (1200V-class). The breakdown voltage (withstand voltage) is a voltage limit at which errant operation or damage of an element does not occur. During measurement of the ON resistance of the trench gate MOSFET 41, a pn junction temperature Tj of the n$^-$-type drift region 2 and the p-type base region 4 of the trench gate MOSFET 41 was room temperature (RT), for example, about 25 degrees C.

From the results depicted in FIG. 5, in the second example, it was confirmed that as the cell pitch P11 of the trench gate MOSFET 41 is reduced, the ON resistance may be reduced.

A relationship of the cell pitch P12 of the flat SBD 42 and the operation starting current of the body diode of the trench gate MOSFET 41 was verified. FIG. 6 is a characteristics diagram depicting a relationship of the cell pitch of the flat SBD and drain current density at the start of operation of the body diode of the trench gate MOSFET, in the silicon carbide semiconductor device according to the embodiment. In FIG. 6, the cell pitch P12 (=the cell pitch P12 of the flat SBD 42/the pitch P1 of the gate trench 7) of the flat SBD 42 with respect to the pitch P1 of the gate trench 7 is depicted along a horizontal axis and the drain current density at the start of operation of the body diode of the trench gate MOSFET 41 is depicted along a vertical axis.

Figure 6:
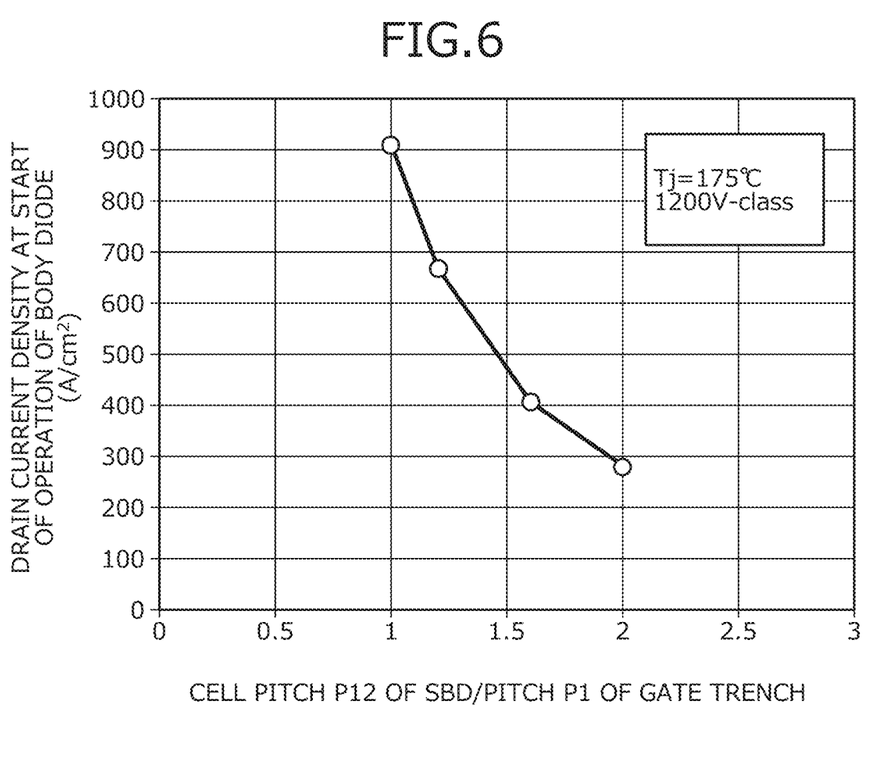
FIG. 6 is a characteristics diagram depicting a relationship of cell pitch of a flat SBD and drain current density at a start of operation of the body diode of the trench gate MOSFET, in the silicon carbide semiconductor device according to the embodiment.

The relationship of the cell pitch P12 of the flat SBD 42 and the operation starting current of the body diode of the trench gate MOSFET 41 in the silicon carbide semiconductor device according to the embodiment (hereinafter, third example) is depicted in FIG. 6. The trench gate MOSFET 41 had a breakdown voltage of 1200V. During measurement of the operation starting current of the body diode of the trench gate MOSFET 41, the pn junction temperature Tj of the n$^-$-type drift region 2 and the p-type base region 4 of the trench gate MOSFET 41 was 175 degrees C.

From the results depicted in FIG. 6, it was confirmed that in the third example, as the cell pitch P12 of the flat SBD 42 is reduced, the operation starting current of the body diode of the trench gate MOSFET 41 may be increased.

In the foregoing, the present invention may be modified within a range not departing from the spirit of the invention. For example, in the embodiment above and the examples, dimensions, impurity concentrations, etc. of components are variously set according to necessary specifications. Further, in the embodiment above, while a case is described where an epitaxial substrate is used in which an epitaxial layer is deposited on the semiconductor substrate (starting substrate), without limitation hereto, for example, all regions configuring the device may be diffusion regions formed by ion implantation in the semiconductor substrate.

Further, while the present invention is described taking a MOSFET as an example, without limitation hereto, the present invention is applicable to a MOS semiconductor device such as an insulated gate bipolar transistor (IGBT), a rectification semiconductor device such as a Schottky barrier diode (SBD), etc. Further, the present invention achieves similar effects even when a wide bandgap semiconductor material (for example, gallium (Ga)) other than silicon carbide is used. Further, the present invention is similarly implemented when conductivity types (n-type, p-type) are reversed.

According to the present invention, the cell pitch of the MOS gate structure (trench gate MOSFET) and the cell pitch of the Schottky barrier diode (flat SBD) may be set independently of each other.

The semiconductor device according to the present invention achieves an effect in that the tradeoff relationship between reducing the ON resistance of the trench gate MOSFET having the flat SBD built into the same semiconductor substrate and improving the degradation suppression effect of the body diode, may be improved.

As described, the semiconductor device according to the present invention is useful for MOS semiconductor devices having a trench gate structure with a flat SBD built into a single semiconductor substrate and is particularly suitable for MOS silicon carbide semiconductor devices having a trench gate structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a semiconductor substrate of a first conductivity type and containing a semiconductor material having a bandgap wider than that of silicon;
   a plurality of trenches provided a predetermined depth from a front surface of the semiconductor substrate, the plurality of trenches being provided at a predetermined pitch along a first direction parallel to the front surface of the semiconductor substrate;
   a gate electrode provided in the trench, via a gate insulating film;
   a first semiconductor region of a second conductivity type provided spanning between adjacent trenches of the plurality of trenches, in a first mesa region between the adjacent trenches;
   a second semiconductor region of the first conductivity type selectively provided in the first semiconductor region;
   a MOS gate structure constituted by the gate insulating film, the gate electrode, the first semiconductor region and the second semiconductor region;
   a conductive layer sandwiched between adjacent trenches of the plurality of trenches and provided on a surface of a second mesa region excluding the first mesa region;
   a Schottky barrier diode configured by a Schottky junction of the conductive layer and the semiconductor substrate;
   a third semiconductor region of the second conductivity type selectively provided in the semiconductor substrate, the third semiconductor region in contact with bottoms of the plurality of trenches;
   a fourth semiconductor region of the second conductivity type selectively provided between the first semiconductor region and the third semiconductor region, the fourth semiconductor region being provided in contact with the first semiconductor region and the third semiconductor region, and separated from the plurality of trenches;
   a first electrode electrically connected to the first semiconductor region, the second semiconductor region, and the conductive layer; and
   a second electrode provided at a rear surface of the semiconductor substrate, wherein
   the plurality of trenches are disposed in a striped shape extending along a second direction orthogonal to the first direction and parallel to the front surface of the semiconductor substrate, and
   the third semiconductor region is disposed in a striped shape extending along the first direction.

2. The semiconductor device according to claim 1, wherein
   one unit cell of the MOS gate structure is provided in one first mesa region, and
   the unit cell of the MOS gate structure is disposed at a predetermined pitch along the first direction.

3. The semiconductor device according to claim 1, wherein
   a unit cell of the Schottky barrier diode is disposed at a predetermined pitch along the second direction.

4. The semiconductor device according to claim 2, wherein
   for every two of the first mesa regions disposed adjacently to each other along the first direction, one of the second mesa regions is disposed.

5. The semiconductor device according to claim 1, further comprising
   a fifth semiconductor region of the first conductivity type provided in a surface layer of the front surface of the semiconductor substrate, the fifth semiconductor region reaching a position deeper from the front surface of the semiconductor substrate than are the bottoms of the plurality of trenches, the fifth semiconductor region having an impurity concentration higher than an impurity concentration of the semiconductor substrate, wherein
   the first semiconductor region, the third semiconductor region, and the fourth semiconductor region are disposed in the fifth semiconductor region.

* * * * *